United States Patent [19]
Ohba

[11] Patent Number: 5,239,485
[45] Date of Patent: * Aug. 24, 1993

[54] SYSTEM AND METHOD FOR DETERMINING THE REVISION HISTORY OF PRINTED CIRCUIT BOARDS

[75] Inventor: Akira Ohba, Tokyo, Japan

[73] Assignee: Kabushiki Kaisha Toshiba, Kawasaki, Japan

[ * ] Notice: The portion of the term of this patent subsequent to Jul. 24, 2009 has been disclaimed.

[21] Appl. No.: 330,036

[22] Filed: Mar. 29, 1989

[30] Foreign Application Priority Data

Mar. 30, 1988 [JP] Japan .................. 63-77085

[51] Int. Cl.$^5$ ............................. G06F 15/46
[52] U.S. Cl. ..................... 364/550; 395/575
[58] Field of Search .......... 364/200, 900, 550, 551.01, 364/401, 402

[56] References Cited

U.S. PATENT DOCUMENTS

| | | | |
|---|---|---|---|
| 4,442,502 | 4/1984 | Friend et al. | 364/900 |
| 4,468,731 | 8/1984 | Johnson et al. | 364/200 |
| 4,578,773 | 3/1986 | Desai et al. | 364/900 |
| 4,649,514 | 3/1987 | Berger | 364/900 |
| 4,802,094 | 1/1989 | Nakamura et al. | 364/550 |

OTHER PUBLICATIONS

Digital Equipment Corp., "Vax 8200/8300: Mini-Reference", May 1986, pp. 19-20.

Primary Examiner—Kevin J. Teska
Attorney, Agent, or Firm—Finnegan, Henderson, Farabow, Garrett & Dunner

[57] ABSTRACT

A system for determining the revision history of printed circuit boards within a computer system. The revision number of printed circuit boards within a computer system can be conveniently ascertained, and there is no need to turn off the computer system or remove the panel because visual inspection of the printed circuit boards is not required. The system includes a revision number setting unit mounted on each printed circuit board for setting revision number data in each circuit board. The revision number and corresponding revision history is displayed in response to a command input from a keyboard. A processor reads revision number data from a selected printed circuit board in the computer system and provides it to a CRT.

6 Claims, 1 Drawing Sheet

SYSTEM AND METHOD FOR DETERMINING THE REVISION HISTORY OF PRINTED CIRCUIT BOARDS

BACKGROUND OF THE INVENTION

This invention relates to a printed circuit board management system, and more particularly to a system for determining the revision history of a number of printed circuit boards.

In a computer system that executes prescribed functions using a number of printed circuit boards of a variety of types, the circuit boards are frequently revised in order to improve or update their performance.

If some printed circuit boards have been improved or updated, it may be necessary to determine the revision history of the circuit boards being used in a computer system. Typically, a revised printed circuit board is painted with a color corresponding to a particular revision number that can be recognized when it is visually examined. Once the revision number of the printed circuit board is identified, any changes or additional features that have been incorporated into the circuit board can be ascertained by then referring to a record of the revision history corresponding to that revision number.

However, in a conventional computer system, in order to identify the revision number of a printed circuit board, it is often necessary to turn off the computer system and remove the appropriate panel for inspection. After identifying the revision number, it also may be necessary to utilize separate written records listing the changes and features associated with each revision number of the printed circuit board.

Therefore, in order to make identification of the revision number of a printed circuit board within a computer system more convenient, there is a need for a method of determining the circuit board revision history without visually inspecting the circuit board. There also is a need for a computer system that stores and conveniently reads out revision history data identifying the changes and/or additional features that have been incorporated into each revision number of the printed circuit board.

SUMMARY OF THE INVENTION

It is an object of this invention to overcome some of the problems and disadvantages of the prior art.

It is therefore desirable to provide an improved system and method for determining the revision history of a printed circuit board.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purposes of the invention, as embodied and broadly described herein, a system for determining the revision history of a printed circuit board within a computer system is provided. This system includes revision number setting circuitry on the printed circuit board for setting revision number data in the printed circuit board; a memory for storing revision history data in the computer system corresponding to the revision number data a; display for displaying the revision number data and the revision history data corresponding to the revision number data; input logic for providing a revision number display command to command reading out and display of the revision number data for the printed circuit board and the revision history data corresponding to the revision number data; and a processor unit, connected to the revision number setting circuitry, the memory, the display, and the input logic, and responsive to receipt of the revision number display command, for reading the revision number data out of the revision number setting circuitry and providing the revision number data to the display, and for reading the revision history data corresponding to the revision number data out of the memory and providing the corresponding revision history data to the display.

According to another aspect of the present invention, a method for determining the revision history of a printed circuit board within a computer system having a display is provided that includes the steps of setting revision number data in the printed circuit board; storing revision history data in the computer system corresponding to the revision number data; providing a revision number display command to command reading out and display of the revision number data for the printed circuit board and the revision history data corresponding to the revision number data; reading out the revision number data from the printed circuit board, reading out the revision history data corresponding to the revision number data from the computer system, providing the revision number data to the display, and providing the corresponding revision history data to the display, in response to receipt of the revision number display command; and displaying the revision number data and the revision history data corresponding to the revision number data.

The accompanying drawings, which are incorporated in and constitute a part of this specification, illustrate a preferred embodiment of the invention, and together with the description, serve to explain the principles of the invention.

DESCRIPTION OF THE PREFERRED EMBODIMENT

Reference will now be made in detail to the present preferred embodiment of the invention, an example of which is illustrated in the accompanying drawings.

In accordance with the present invention, there is provided a system for determining the revision history of a printed circuit board within a computer system. A block diagram of a printed circuit board management system according to this invention is shown in FIG. 1.

Figure 1:
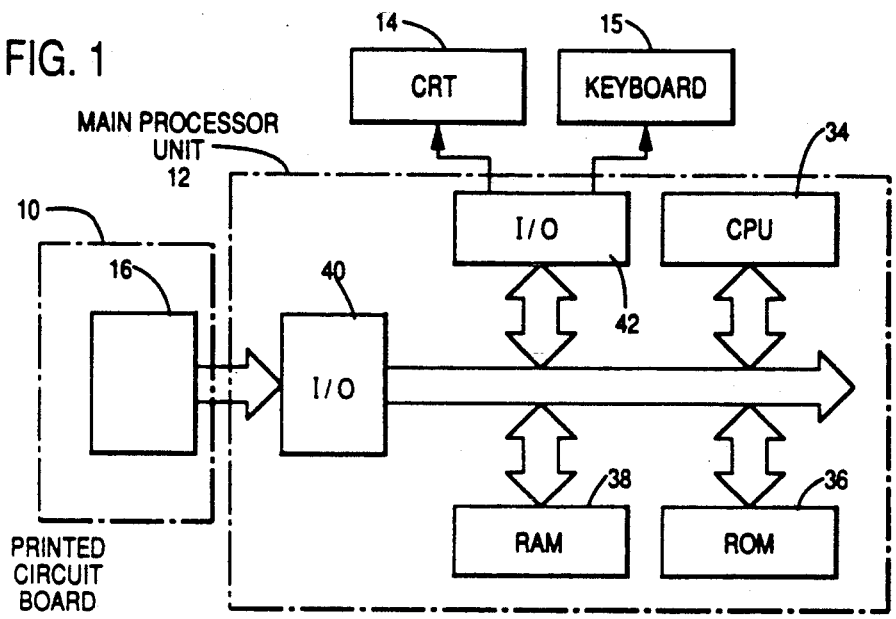
FIG. 1 is a block diagram of a system for determining the revision history of a printed circuit board.

The printed circuit board management system shown in FIG. 1 includes a number of printed circuit boards 10 of various types; a main processor unit 12 connected to each of the printed circuit boards; a CRT 14 that displays data provided by main processor unit 12; and a keyboard 15 providing input commands and data to main processor unit 12.

In the present invention, revision number setting means on the printed circuit board for setting revision number data in the printed circuit board is provided. In the embodiment shown in FIG. 1, the revision number setting means corresponds to a revision number setting device 16. Each printed circuit board 10 consists of a board formed of glass and epoxy sheet, various elements mounted on this board, such as integrated circuits and electrical components, and the revision number setting device 16, which is mounted on the board.

In accordance with the invention, display means for displaying revision number data and revision history data corresponding to the revision number data is included. Preferably, the display means is provided by CRT 14. The revision history data displayed by the CRT identifies the changes and/or additional features that have been incorporated into each revision number of the printed circuit board.

In this invention, there is provided input means for providing a revision number display command to command reading out and display of the revision number data for the printed circuit board and the revision history data corresponding to the revision number data. In the preferred embodiment of the invention, the input means corresponds to keyboard 15.

The present invention includes processing means, connected to the revision number setting means, the memory means, the display means, and the input means, and responsive to receipt of the revision number display command, for reading the revision number data out of the revision number setting means and providing the revision number data to the display means, and for reading the revision history data corresponding to the revision number data out of the memory means and providing the corresponding revision history data to the display means. As embodied herein, the processing means is provided by main processor unit 12.

In accordance with the invention, there also is provided memory means for storing revision history data in the computer system corresponding to the revision number data. In a preferred embodiment, a RAM 38 stores revision history data corresponding to the revision number data of the printed circuit board. This revision history data identifies the changes and/or additional features that have been incorporated into a printed circuit board having the revision number specified by the revision number data. Preferably, RAM 38 also stores the revision number data read from the printed circuit boards or provided to the CRT.

Figure 2:
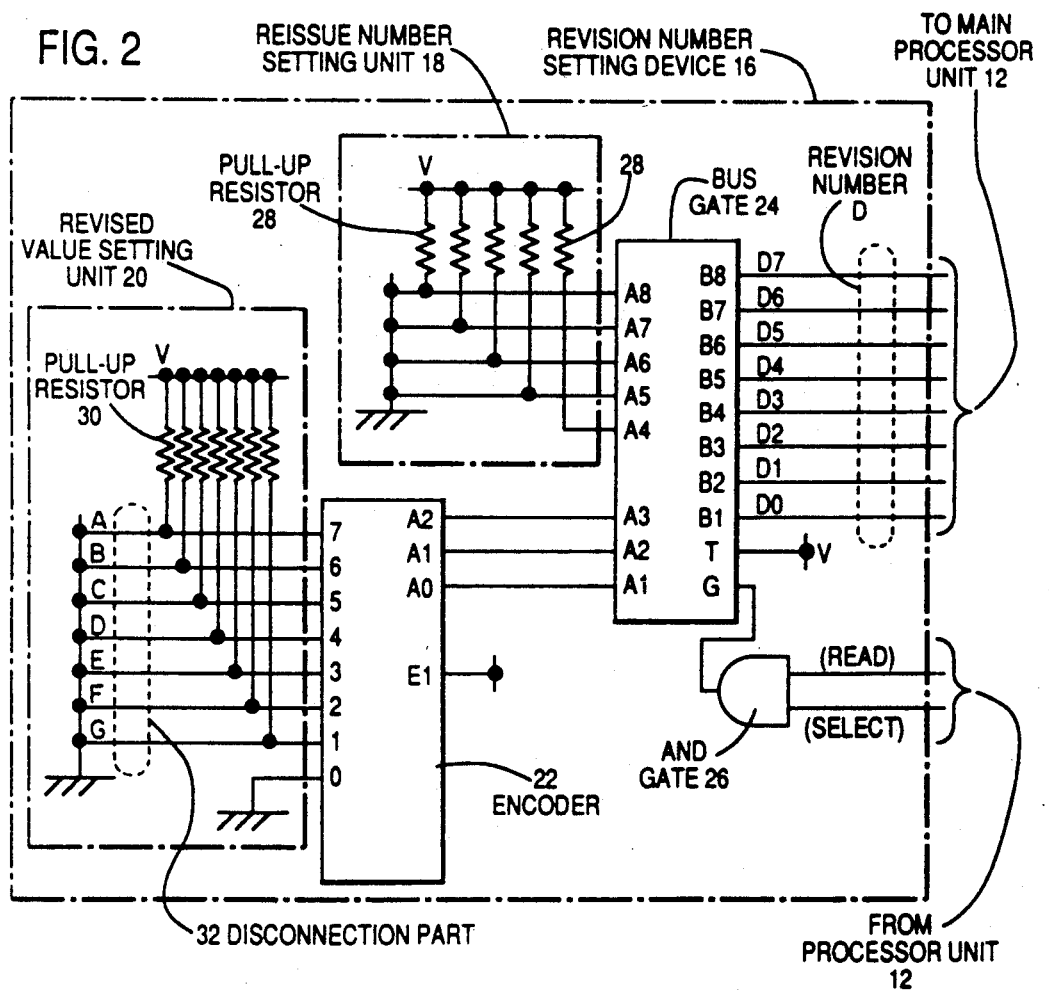
FIG. 2 is a schematic of a revision number setting device.

FIG. 2 is a schematic of revision number setting device 16 shown in FIG. 1. Revision number setting device 16 includes a reissue number setting unit 18; a revised value setting unit 20; an encoder 22; a bus gate 24; and an AND gate 26.

When commands or data are input from keyboard 15, the commands and data are processed by main processor unit 12. A revision number display command selecting one of the printed circuit boards is input from keyboard 15 to main processor unit 12. In the example shown in FIG. 2, a revision number D is read by processor unit 12 from bus gate 24 of revision number setting device 16 in the selected printed circuit board. The revision number D is then provided by main processor unit 12 to CRT 14 for display.

In order to read the revision number from the printed circuit board selected by a revision number display command from keyboard 15, main processor unit 12 supplies both a SELECT signal and a READ signal to AND gate 26 of the revision number setting device in the selected printed circuit board. When the AND gate is enabled is response to receipt of the SELECT and READ signals, bus gate 24 is turned on and couples the revision number D, which is generated by reissue number setting unit 18 and encoder 22, to main processor unit 12 via a bus connecting revision number setting device 16 to main processor unit 12.

Processor unit 12 also provides revision history data for the printed circuit board to the display means by reading the revision history data stored in RAM 38 that is associated with the revision number read by the processor unit from bus gate 24.

In a preferred embodiment, reissue number data and revised value data may be obtained from printed circuit board 10. Thus, data corresponding to a reissue number for printed circuit board 10 is set in reissue number setting unit 18. Data corresponding to a revised value specifying the number of revisions to a board having a particular reissue number is set in revised value setting unit 20. Both the reissue number data and the revised value data are read out and supplied to main processor unit 12.

Reissue number setting unit 18 includes a number of pull-up resistors 28. Every time a reissue of printed circuit board 10 is performed, the wiring is updated in order to change the reissue number data.

Revised value setting unit 20 includes a number of pull-up resistors 30 and a disconnection part 32. Every time there is a revision to the printed circuit board 10 on which this revision number setting device 16 is mounted, one of the leads of disconnection part 32 is disconnected, thereby changing the revised value data.

There are, of course, numerous equivalent ways in which revision number data may be set in setting units 18 and 20, such as by using switches or jumper leads.

Encoder 22 converts the decoded eight bit revised value data to encoded three bit revised value data. The encoded data is then supplied to bus gate 24 for output to main processor unit 12. Encoding of the revised value data reduces the number of bits of revision number data and allows use of fewer lines in order to transmit the revision number data. However, encoder 22 can be removed if bit compression of revised value data is unnecessary because there is some spare capacity.

In main processor unit 12 shown in FIG. 1, a CPU 34 is provided consisting of a microprocessor that executes program instructions. A ROM 36 stores the program instructions, including instructions executed in response to receipt of a revision number display command from keyboard 15.

An I/O interface 40 electrically connects CPU 34, RAM 38, and printed circuit board 10. Another I/O interface 42 electrically connects CPU 34, RAM 38, and CRT 14 or keyboard 15.

In this system for determining the revision history of a printed circuit board, the revision number of a printed circuit board within a computer system can be conveniently ascertained, and there is no need to turn off the computer system or remove the panel because visual inspection of the printed circuit board is not required.

It will be apparent to those skilled in the art that various modifications and variations can be made in the system and method for determining the revision history of a printed circuit board provided by the present invention without departing from the scope or spirit of the invention. Thus, it is intended that the present invention cover the modifications and variations of this invention provided they come within the scope of the appended claims and their equivalents.

What is claimed is:

1. A system for determining revision history of a printed circuit board within a computer system, comprising:
    revision number setting means on the printed circuit board for setting revision number data for the printed circuit board;
    memory means for storing revision history data in the computer system corresponding to the revision number data;
    display means for displaying the revision number data and at least the revision history data corresponding to the revision number data;
    input means for providing a revision number display command to command reading out and display of the revision number data for the printed circuit board and at least the revision history data corresponding to the revision number data; and
    processing means, connected to the revision number setting means, the memory means, the display means, and the input means, and responsive to receipt of the revision number display command, for reading the revision number data out of the revision number setting means and providing the revision number data to the display means, and for reading at least the revision history data corresponding to the revision number data out of the memory means and providing at least the corresponding revision history data to the display means.

2. The system of claim 1, wherein the revision number setting means includes reissue number setting means for setting reissue number data for the printed circuit board, and revised value setting means for setting revised value data for the printed circuit board.

3. The system of claim 1 wherein the processing means includes CPU means for executing program instructions in response to receipt of the revision number display command.

4. The system of claim 1 wherein the display means comprises a CRT.

5. A method for determining revision history of a printed circuit board, the printed circuit board included within a computer system having a display, comprising the steps of:
    setting revision number data for the printed circuit board;
    storing revision history data in the computer system corresponding to the revision number data;
    providing a revision number display command to command reading out and display of the revision number data for the printed circuit board and at least the revision history data corresponding to the revision number data;
    reading out the revision number data from the printed circuit board, reading out at least the revision history data corresponding to the revision number data from the computer system, providing the revision number data to the display, and providing at least the corresponding revision history data to the display, in response to receipt of the revision number display command; and
    displaying the revision number data and at least the revision history data corresponding to the revision number data.

6. The method of claim 5 wherein the step of setting revision number data for the printed circuit board includes setting reissue number data for the printed circuit board and setting revised value data for the printed circuit board.

* * * * *